United States Patent [19]
Sugimura et al.

[11] Patent Number: 5,785,838
[45] Date of Patent: Jul. 28, 1998

[54] METHOD FOR PRODUCING AN OXIDE FILM

[75] Inventors: Hiroyuki Sugimura, Tsukuba; Tatsuya Uchida, Miyagi, both of Japan

[73] Assignee: Nikon Corporation by Hiroyuki Sugimura, Tokyo, Japan

[21] Appl. No.: 574,986

[22] Filed: Dec. 19, 1995

Related U.S. Application Data

[63] Continuation of Ser. No. 202,126, Feb. 25, 1994, abandoned.

[30] Foreign Application Priority Data

Feb. 26, 1993 [JP] Japan ........................ 5-039120
Jul. 22, 1993 [JP] Japan ........................ 8-181448

[51] Int. Cl.$^6$ ........................ C25D 11/02
[52] U.S. Cl. ........................ 205/83; 204/164; 205/88; 205/124; 205/136; 437/237; 437/239
[58] Field of Search ........................ 204/164; 205/80, 205/83, 88, 97, 118, 122, 124, 136; 437/237, 239

[56] References Cited

U.S. PATENT DOCUMENTS

| | | | |
|---|---|---|---|
| 3,355,371 | 11/1967 | Hile et al. | 204/164 |
| 3,394,066 | 7/1968 | Miles | 204/164 |
| 4,425,496 | 1/1984 | le Fur et al. | 219/384 |
| 4,853,512 | 8/1989 | Scheider | 204/129.5 |
| 4,941,955 | 7/1990 | Schuster | 204/129.5 |
| 4,968,390 | 11/1990 | Bard et al. | 204/15 |
| 5,004,530 | 4/1991 | Tanaka | 204/224 M |
| 5,202,004 | 4/1993 | Kwak et al. | 204/153.1 |
| 5,348,638 | 9/1994 | Nakagawa | 205/122 |

OTHER PUBLICATIONS

John F O'Hanlon, Plasma Anodization of Metals and Semiconductors, *The Journal of Vacuum Science and Technology*, vol. 7, No. 2, 1970, pp. 330–338 No month available.

Hiroyuki Sugimura, Scanning Tunneling Microscope Tip-Induced Anodization for Nanofabrication of Titanium, *J. Phys. Chem.*, 1994, vol. 98, No. 16, pp. 4352–4357 No month available.

T. Thundat et al. Modification of Tantalum Surfaces by Scanning Tunneling Microscopy in an Electrochemical Cell, *J. Vac. Sci. Technol.* A 8(4), Jul./Aug. 1990, pp. 3537–3541.

*Primary Examiner*—Kathryn L. Gorgos
*Assistant Examiner*—William T. Leader
*Attorney, Agent, or Firm*—Wenderoth, Lind & Ponack

[57] ABSTRACT

The present invention provides a method for producing an oxide film wherein a sharp-pointed processing electrode is positioned close to the material to be processed in an oxygen-containing gas, and a voltage in the single digit range is impressed across the material and the electrode so that the surface of the material is positive and the electrode is negative thereby causing an electric current to flow across the material and the electrode. The surface of the material reacts electrochemically with oxygen adsorbed on the surface of the material to anodize the surface immediately proximate the electrode. The method makes possible the formation of a patterned oxide film with a resolution of 0.1 μm or less, thus surpassing the limit of conventional oxide film production methods. Processing efficiency and freedom of processing are significantly improved because an arbitrary oxide film pattern can be formed directly on the surface of a material thereby eliminating the use of a large number of complicated production processes.

11 Claims, 5 Drawing Sheets

METHOD FOR PRODUCING AN OXIDE FILM

This application is a continuation of now abandoned application, Ser. No. 08/202,126, filed Feb. 25, 1994.

FIELD OF THE INVENTION

The present invention relates to a method to produce oxide film and an apparatus therefor. More particularly, the present invention relates to a method to produce oxide film and an apparatus therefor, said oxide film being a useful microprocessing technique for the production of IC LSI and other semiconductor elements, diffraction gratings, zone plates and other optical elements.

The present invention further relates to a resist for microprocessing. More particularly, the present invention relates to a resist for microprocessing which is useful for more precise production of IC, LSI and other semiconductor elements, diffraction gratings and other optical elements.

PRIOR ART AND PROBLEMS

Fine oxide film patterns are formed on the surface of a material to be processed in the production of IC, LSI and other semiconductor elements, and diffraction gratings, zone plates and other optical elements. One of thee known methods to form these oxide film patterns is photolithography. The photolithographic process usually consists of:

1) production of photomasks of a specified pattern,
2) coating of the surface of a material to be processed with photoresist,
3) exposure of photoresist by projecting a photomask image on the photoresist surface, and
4) development of the photoresist.

A photoresist pattern is formed on the surface of a material to be processed using photolithography.

However, when an oxide film pattern is formed on the surface of a material to be processed which already has a formed photoresist pattern, the material must be oxidized and the residual resist on the material must be peeled off, which consumes much time and is labor-intensive.

With photolithography, further, resolution is limited by the wavelength of light rays. Even if ultraviolet rays having short wavelength are used for exposure, a pattern finer than 0.2 μm can not be formed. For this reason, microprocessing by photolithography has a limit.

Photolithography requires a number of processes, and thus it is difficult to maintain quality of the pattern. In addition, when forming a number of different patterns, a photomask must be prepared for every individual pattern. Photolithography thus lacks freedom of processing.

Thus, conventional oxide film production methods typically represented by photolithography have never been satisfactory in terms of processing efficiency, processing performance and freedom of processing in the forming of fine oxide film patterns.

SUMMARY OF THE INVENTION

The present invention was developed in consideration of the above circumstances and intends to solve the problems of the conventional oxide film production methods and provide a novel oxide film production method to enhance processing efficiency, processing performance and freedom of processing and a production apparatus therefor.

To solve the above problems, the present invention provides an oxide film production method wherein a sharp-pointed processing electrode is brought close to the material to be processed in an oxygen-containing molecular gas atmosphere, and a voltage is impressed across the material to be processed and the processing electrode so that the surface of the material to be processed immediately below the electrode is anodized. The present invention further provides an oxide film production apparatus therefor above comprising a sharp-pointed processing electrode which can be brought close to a material to be processed, a means to detect electric current flowing across the processing electrode and the surface of the material to be processed, a means to control electric current at a constant level by adequately controlling the relative position of the processing electrode and the material to be processed in accordance with the detected electric current flowing across the processing electrode and the surface of the material to be processed, a means to supply oxygen-containing molecular gas, and a means to control above said means of supplying oxygen-containing molecular gas.

The present invention further intends to provide a novel resist for microprocessing allowing formation of a fine pattern of a high resolution of 0.1 μm or less exceeding the level of the conventional photolithography on the surface of a substrate and free transfer of an arbitrary fine pattern to the surface of a material.

To solve the above problems, the present invention provides a resist for microprocessing which consists of a multilayer resist wherein the outmost layer is made of a material forming an oxide film when anodized.

DETAILED DESCRIPTION OF THE INVENTION

The oxide film production method of the present invention is a totally new method never seen before. With this method, first, a material to be processed is placed in an oxygen-containing molecular gas atmosphere. A sharp-pointed processing electrode is brought close to the material, and a voltage is impressed across the material and the electrode so that the surface of the material is positive and the electrode negative. Electric current starts to flow across the electrode and the material as the electrode approaches the surface of the material. The surface of the material reacts electrochemically with the oxygen-containing molecular substance or oxygen-containing molecular compounds adsorbed on the surface of the material to anodize said surface.

An oxide film pattern of an arbitrary shape and a high resolution of 0.1 μm and above can be formed on the surface of the material by minimizing the area to be anodized on the surface of the material with the use of a sharp-pointed needle as the electrode, and by moving the electrode along the surface of the material while controlling the position of the electrode so that a constant amount of current flows across the material and the electrode at all times.

Figure 1:
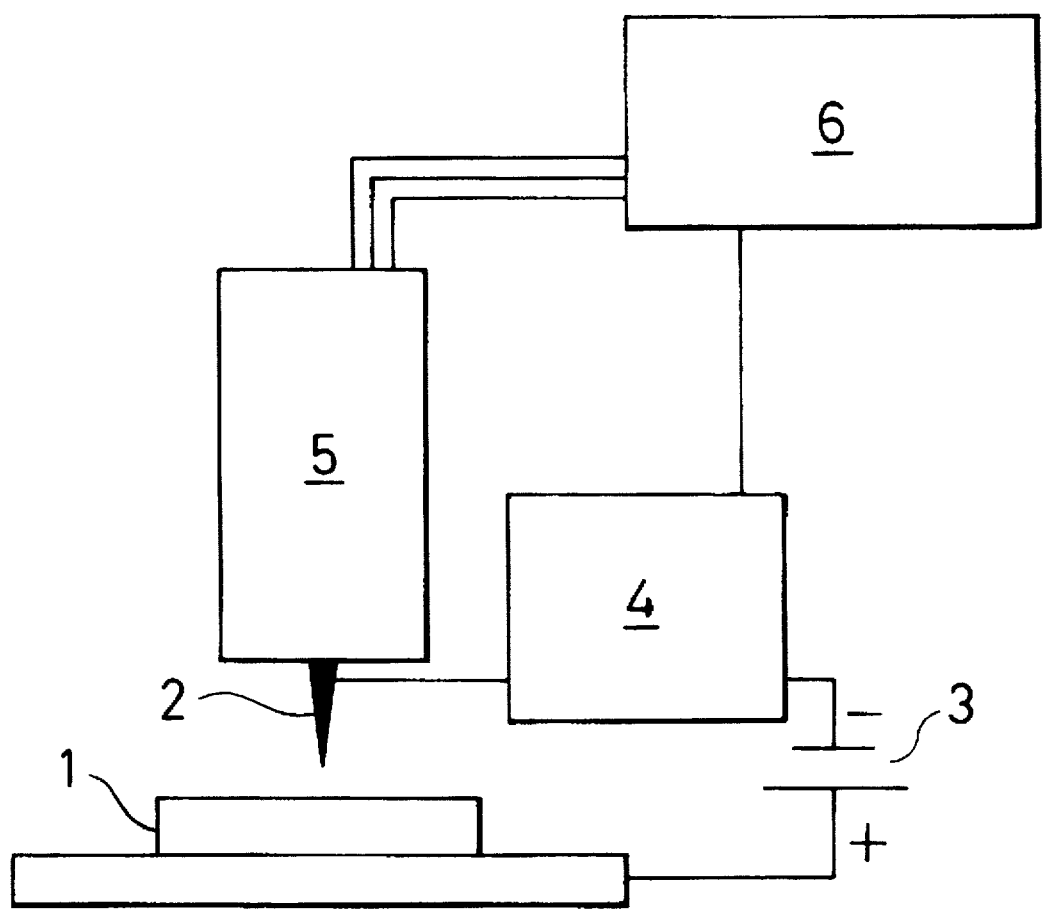
FIG. 1 shows a construction drawing showing a working example of the present invention.

FIG. 1 is a conceptual drawing showing the construction of an apparatus for the method of the present invention.

As shown in FIG. 1, for example, a material to be processed (1) and a processing electrode (2) are connected to a DC power source (3) so that the former is positive and the latter negative. The electrode (2) has a sharp needle-like point. When a voltage is impressed across the material (1) and the electrode (2), and the electrode (2) is moved close to the material (1) by the operation of a relative position control means (5), electric current flows across the electrode (2) and the material (1). Electric current is detected by a current detecting circuit (4). Relative position of the electrode (2) and the material (1) is controlled by the relative position control means (5) so that the detected current is always constant.

The relative position control means (5) may be, for example, a three-dimensional actuator.

The current detecting circuit (4) and the relative position control means (5) may be controlled, for example, by a control circuit (6).

The apparatus is provided with a means to supply gases to create an oxygen-containing molecular gas atmosphere and a control means therefor (not shown). Oxygen-containing molecular gas adsorbed on the surface of the material to be processed reacts electrochemically with the material to be processed (1) at a high spatial resolution.

Molecular gas atmosphere may be, for example, controlled like this: the material to be processed (1), processing electrode (2) and the relative position control means (5) are placed in a glove box or the like and the atmosphere in the glove box is substituted with nitrogen or the like in order to control concentration of oxygen-containing gas molecules in the glove box by varying the flow rate for nitrogen.

Water vapor containing oxygen or oxygen molecules may be used as oxygen-containing molecules. It is further possible to use oxidizing gas molecules such as nitric oxide.

The radius of the tip of the processing electrode should preferably be 100 nm or less because the resolution of processing is affected by the shape of the tip of the electrode (2). The material of the electrode may be platinum, gold or other precious metal or its alloys, or conducting diamond or other electrochemically stable material. Of these, conducting diamond, in particular, is not only electrochemically stable, but also mechanically strong, and thus is suitable for stable microprocessing.

The method of the present invention can be applied to metals such as titanium, tantalum, tungsten and aluminum, and semiconductors such as silicon, germanium, gallium arsenide and indium phosphorus as well as all other materials that will form an oxide film when anodized. In addition, difficult-to-anodize materials such as n-type semiconductors can also be stably processed when a suitable means or condition is used such as oxidation under light rays with energy level higher than the band gap of the semiconductor.

Figure 2:
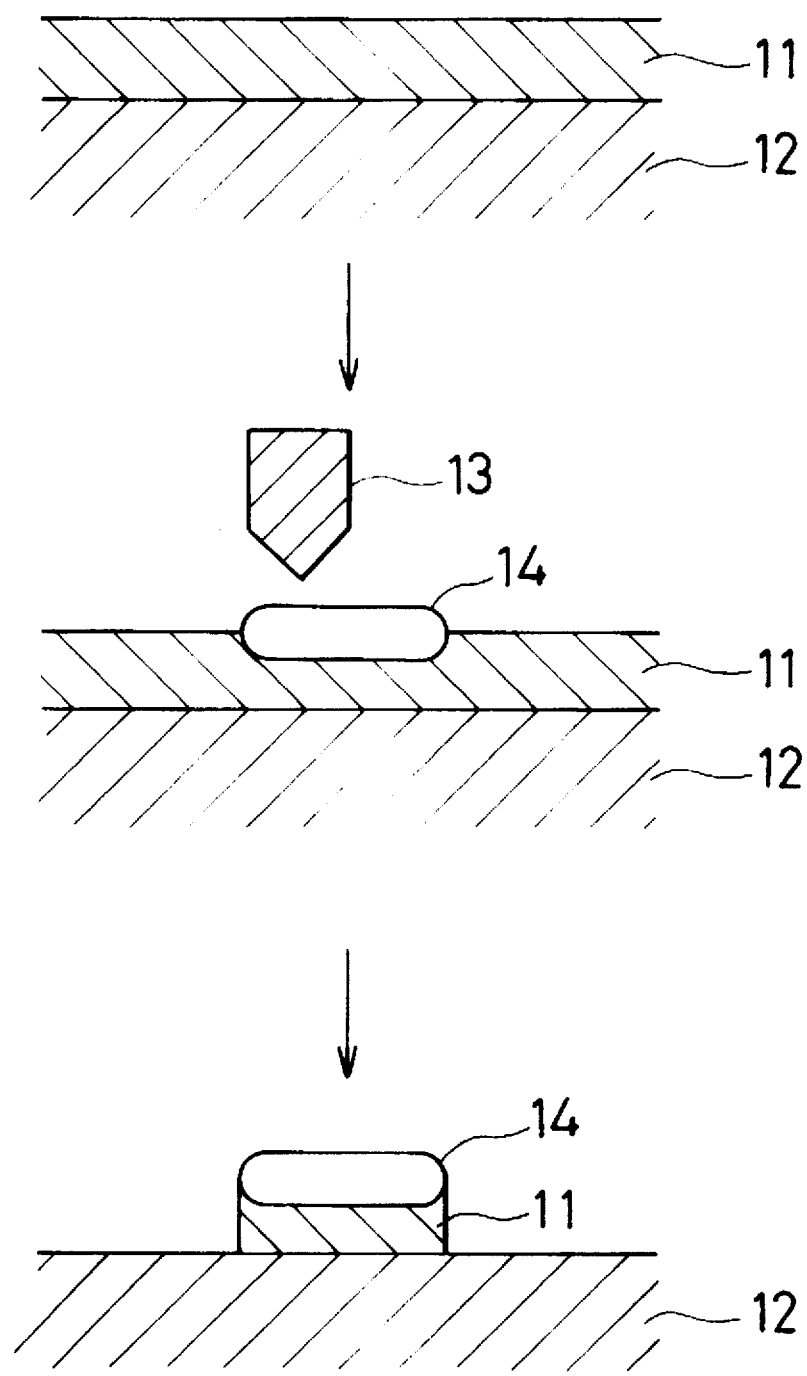
FIG. 2 shows a conceptual drawing illustrating the basic construction of the resist of the present invention.

More specifically, according to the resist of the present invention, as shown in FIG. 2 for example, the outmost layer (11), comprising one or more layer, and consisting of an oxide film forming material which is capable of forming an oxide film when anodized (e.g. metallic titanium and its alloys) is provided above the second layer (12). Using the above-mentioned method or apparatus of the present invention, a sharp-pointed microelectrode (13) is brought close to the surface of the outmost layer (11) and a voltage is impressed across the microelectrode (13), as the negative and the outmost layer (11), as the positive terminal, in order to form a fine anodic oxide film (14) pattern on the surface of the outmost layer. Further, the resist outmost layer (11) is etched by a suitable method using the formed anodic oxide film (14) as a mask and the outmost layer (11) is microprocessed. It is possible to further microprocess the substrate or the resist second layer (12) using thus obtained micropattern as a mask.

Formation of the anodic oxide film (14) pattern is described in more detail. In the above method therefor, a material to be processed is placed in an oxygen-containing molecular gas atmosphere. A sharp-pointed microelectrode is brought close to the material to be processed, and a voltage is impressed across the material to be processed and the electrode so that the surface of the material to be processed is positive and the electrode negative. Electric current starts to flow as the electrode approaches the surface of the material to be processed. The surface of the material to be processed reacts electrochemically with the oxygen-containing molecular substance or oxygen-containing molecular compounds adsorbed on said surface to anodize the surface of the material to be processed.

It is thus possible to form an oxide film pattern of an arbitrary shape and a high resolution of 0.1 μm and above on the surface of the material to be processed by minimizing the area to be anodized on the surface of the material by the use of a sharp-pointed needle as the electrode, and by moving the electrode along the surface of the material while controlling the position of the electrode so that a constant amount of current flows across the material and the electrode.

The radius of the tip of the electrode should preferably be 100 nm or less because the resolution is affected by the shape of the tip of an electrode. The material of the electrode may be platinum, gold or other precious metal or its alloys, or conducting diamond or other electrochemically stable material. Of these, conducting diamond, in particular, is not only electrochemically stable, but also mechanically strong, and thus is suitable for stable microprocessing.

This method can be applied to metals such as titanium, tantalum, tungsten and aluminum, and semiconductors such as silicon, germanium, gallium arsenide and indium phosphorus as well as all other materials that can form an oxide film by anodic treatment. In addition, difficult-to-anodize materials such as n-type semiconductors can also be stably processed when a suitable means is used such as oxidation under the light rays with energy level higher than the band gap of the semiconductor.

By processing as above, for example, a very fine anodized pattern of a high resolution of 0.1 μm or less, which is formed on the resist outmost layer of the present invention, can be transferred to various substrates.

Further, when a second layer is inserted to make a multiple layer resist construction, fine patterns can be transferred to the surface of a material which by itself can not withstand the etching of the outmost layer. This feature tremendously extends the range of application of the resist of the present invention.

It is also possible to form an arbitrary pattern of an high resolution, making it possible to manufacture semiconductor elements of a high integration and optical diffraction elements for light rays of extremely short wavelengths such as soft X-rays.

In the present invention, the oxide film forming materials are not necessarily limited to the above titanium metal or their alloys but other anodizing metals such as Zr, Hf, Ta and W as well as their alloys may be used.

It is further possible to provide, below the oxide film forming material (outmost layer), a film made of precious metal, its alloys or various organic substances, in accordance with the objective of the use of the resist, to allow the use of etching means and techniques in various combinations.

Working examples are shown below to further describe the present invention in detail.

Example 1

A titanium substrate was actually processed in an apparatus with a construction shown in FIG. 1. A conducting diamond was used as the processing electrode (2). The substrate was placed in a nitrogen atmosphere at a temperature of 23° C. and relative humidity of 20%.

The diamond electrode was moved along the surface of titanium at a speed of 2 μm/sec while impressing a voltage of 8 V across the diamond electrode and titanium substrate, and controlling electric current at 100 pA constant across the diamond electrode and titanium substrate. A diffraction grating of 30 nm pitch (approximately 33,000 lines per 1 mm) was formed.

Figure 3:
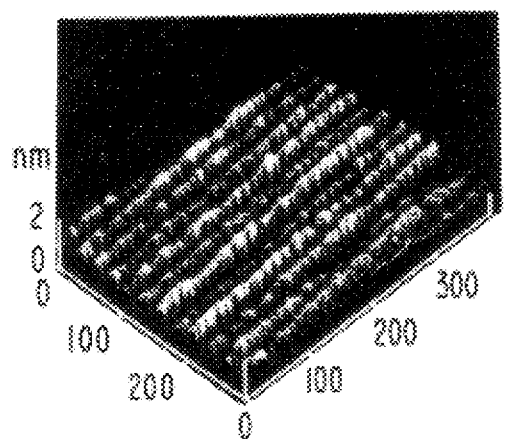
FIG. 3 shows an STM photograph showing the processed surface as a working example of the present invention.

FIG. 3 shows the surface of the substrate after processing as observed under a general scanning tunnel microscope (STM). The convex parts in the figure are the oxide film on the titanium which is formed by the method of the present invention. Water molecules and titanium, adsorbed on the surface of the substrate reacted with each other electrochemically, and the surface was processed with a very high resolution of 30 nm.

Example 2

Figure 4:
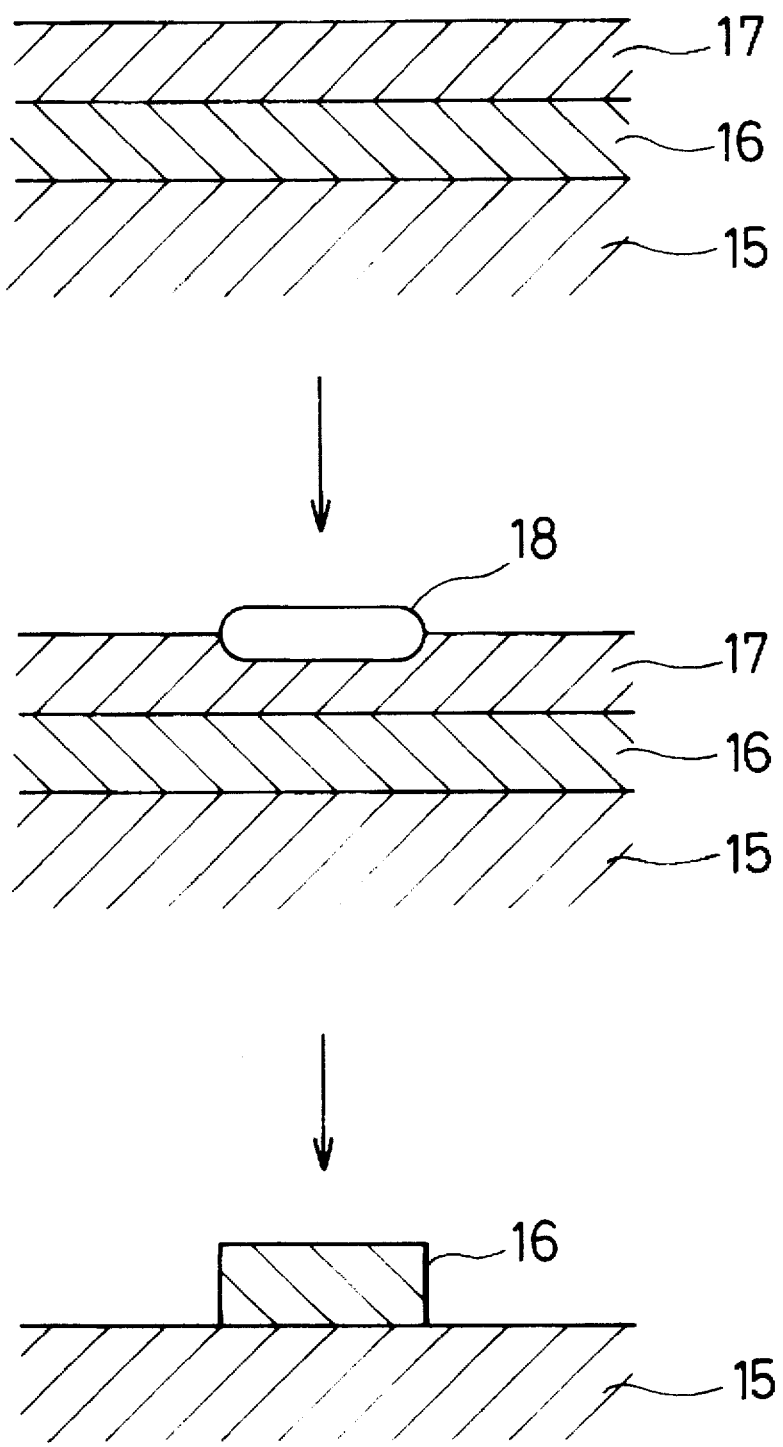
FIG. 4 shows a conceptual drawing illustrating the formation of a fine pattern in working example 2.

A fine pattern was formed on a material to be processed using the resist for microprocessing of the present invention. One example is shown in FIG. 4. In this example, the outmost layer consists of a titanium film (17) which was electron beam deposited in a super high vacuum atmosphere ($1 \times 10^{-6}$ Torr or less) (film thickness: 10 nm), and the second layer, below the outmost layer, is a platinum film (16) 20 nm thick.

A platinum film (16), the second layer, and a titanium film (17), the outmost layer, were vacuum deposited on the surface of a material to be processed (15). The surface of the titanium and platinum film should preferably be as smooth as possible because the resolution of microprocessing will drastically decrease with increasing surface roughness.

A conducting diamond was used as the microelectrode (13) shown in FIG. 2. A fine pattern (18) of titanium oxide film was then formed on the surface of the titanium film (17) in an $N_2$ atmosphere at temperature 23° C. and relative humidity 20%. The diamond electrode was moved above the surface of titanium at a speed of 2 μm/sec while impressing a voltage of 8V across the diamond electrode and titanium, and controlling electric current at 100 pA constant across the diamond electrode and titanium. A fine pattern of 30 nm pitch (approximately 33,000 lines per 1 mm) was formed.

The resulting multilayer film with a fine pattern (18) of titanium oxide film formed thereupon was then immersed in a 0.1% hydrogen fluoride water solution to etch away the titanium film (17) from areas not covered by the oxide film pattern (18).

The second layer, platinum film (16), remained intact in the etching. Platinum of the second layer was then microprocessed by ion beam etching using the fine pattern (18) of the titanium oxide film and the intact titanium film (17) thereunder as a mask. The resultant titanium film (17) was again melted in hydrogen fluoride to eventually obtain a fine pattern of the platinum film (16) as shown in FIG. 4.

Various materials can now be microprocessed using this fine platinum pattern as a mask. The process shown in this working example may also be used for microprocessing precious metals themselves such as platinum and gold.

Example 3

Figure 5:
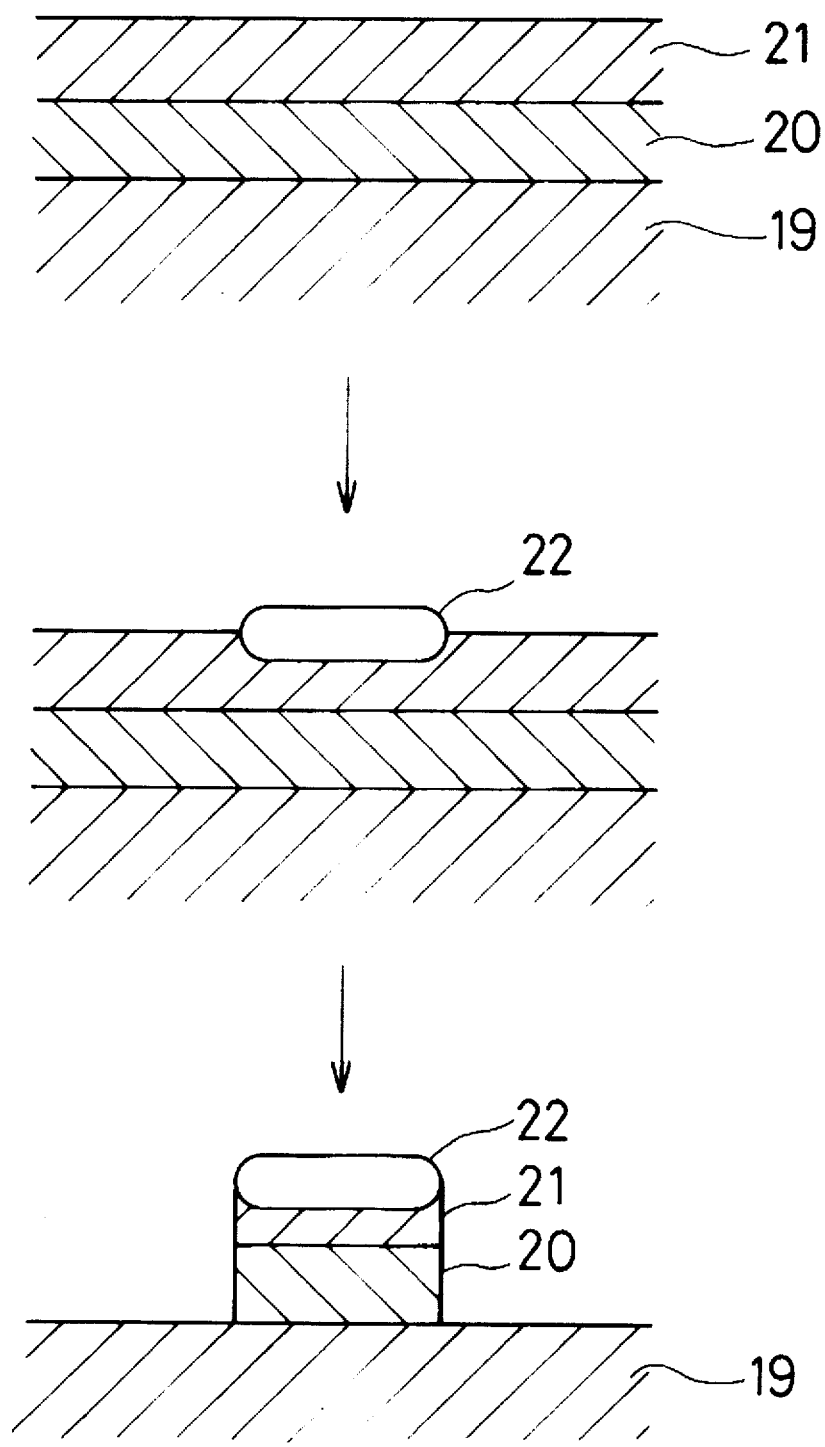
FIG. 5 shows a conceptual drawing illustrating the formation of a fine pattern in working example 3.

In FIG. 5, a titanium film (21) (10 nm thick), which was electron beam deposited in a super high vacuum atmosphere ($1 \times 10^{-8}$ Torr or below), and a polyimide film (20) (100 nm thick) were provided on a material to be processed (19).

More specifically, the polyimide film (20), the second layer, was spin coated on the surface of the material to be coated (19), and the titanium film (21), the outmost layer, was vacuum deposited thereupon.

Next, a fine pattern (22) of a titanium oxide film, which was formed by anodic treatment, was formed on the surface of the titanium film (21).

The resultant pattern-formed multilayer film was then immersed in a 0.1% hydrogen fluoride water solution to etch away the titanium film (21) from areas not covered by the oxide film pattern. During this process, the polyimide film (20), the second layer, remained intact and was not etched.

Using this residual oxide film pattern (22) and the titanium film (21) as a mask, the polyimide film (20), the second layer, was etched to form a fine pattern. Using this as a mask, further, it is possible to microprocess various materials.

Essentially the same effect is produced when the polyimide film by spin coating, the second layer, is replaced by a plasma polymerization film of the hydrocarbon system, LB film, or an organic substance film formed by vacuum deposition, etc.

As described above in detail, the present invention allows the formation of a fine pattern of oxide film of a very high resolution surpassing the limit of the conventional oxide film production methods, and the production of semiconductor elements of a high integration and optical diffraction elements for short wavelengths or for light rays of a very short wavelength such as soft X-rays. In addition, processing efficiency and freedom of processing are significantly improved because an arbitrary oxide film pattern can be formed directly on the surface of a material eliminating the use of a number of complicated production processes.

The present invention further allows the formation of a fine pattern of a very high resolution exceeding the limit of the conventional photolithography, and further the production of semiconductor elements of a high integration and optical diffraction elements for short wavelengths.

We claim:

1. A fine-processing method for producing an oxide film on a surface of a semiconductor to be processed comprising bringing a processing electrode having a tip radius of 100 nm or less close to the surface in an oxygen-containing gas, said oxygen-containing gas being adsorbed on the surface, and impressing a voltage in the single digit range across the material to be processed and the processing electrode, the processing electrode being sufficiently close the surface to allow a current to flow across the material to be processed and the processing electrode, thereby anodizing the surface immediately proximate the processing electrode.

2. The method for producing an oxide film as claimed in claim 1 further comprising moving the processing electrode along the surface of the material to be processed to form an oxide film pattern of an arbitrary shape.

3. The method of claim 2, wherein the oxide film has a pattern with a resolution of 0.1 μm or less.

4. The method for producing an oxide film as claimed in claim 1 wherein the oxygen-containing gas optionally contains water vapor.

5. The method for producing an oxide film as claimed in claim 1 wherein the electric current flowing across the processing electrode and the surface of the material to be processed is detected during anodic oxidation, said current being maintained at a constant level by control of the relative position of the processing electrode and the material to be processed.

6. The method for producing an oxide film as claimed in claim 1 wherein the oxygen-containing gas is flowed onto said surface at a controlled rate during anodic oxidation.

7. The method according to claim 1 wherein the processing electrode is made of conductive diamond.

8. The method of claim 1, wherein the processing electrode does not contact the surface of the material to be processed.

9. The method of claim 1, wherein the voltage is on the order of 8 volts.

10. The method of claim 1, further comprising etching the surface of the material to be processed using the oxide film formed thereon as a mask.

11. The method of claim 1, wherein said semiconductor comprises Si, Ge, GaAs or InP.

* * * * *